United States Patent
Wakui

(10) Patent No.: US 6,286,644 B1
(45) Date of Patent: Sep. 11, 2001

(54) ACTIVE VIBRATION ISOLATOR, EXPOSURE APPARATUS, EXPOSURE METHOD AND DEVICE MANUFACTURING METHOD

(75) Inventor: Shinji Wakui, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/479,215

(22) Filed: Jan. 7, 2000

(30) Foreign Application Priority Data

Jan. 18, 1999 (JP) .................................. 11-009259
Nov. 30, 1999 (JP) .................................. 11-340515

(51) Int. Cl.$^7$ ............................ G03B 27/42; F16M 13/00
(52) U.S. Cl. .......................... 188/378; 267/136; 248/550; 73/662
(58) Field of Search .................................. 248/550, 562, 248/563, 638, 188.2, 559; 73/662, 663, 664, 665; 364/528.15; 702/56; 188/378; 267/136

(56) References Cited

U.S. PATENT DOCUMENTS

| | | | |
|---|---|---|---|
| 5,060,519 | * 10/1991 | Chojitani et al. ........................ | 248/550 |
| 5,187,519 | * 2/1993 | Takabayashi et al. .................. | 355/53 |
| 5,478,043 | * 12/1995 | Wakui ...................................... | 248/550 |
| 5,504,407 | 4/1996 | Wakui et al. ............................ | 318/568.17 |
| 5,511,930 | 4/1996 | Sato et al. ................................ | 414/676 |
| 5,568,032 | 10/1996 | Wakui ...................................... | 318/632 |
| 5,653,317 | * 8/1997 | Wakui ...................................... | 248/550 |
| 5,812,420 | * 9/1998 | Takahashi ................................ | 248/550 |
| 5,900,707 | 5/1999 | Wakui ...................................... | 318/625 |
| 6,170,622 | * 1/2001 | Wakui et al. ............................ | 188/378 |

FOREIGN PATENT DOCUMENTS

| | | |
|---|---|---|
| 6-28698 | 4/1994 | (JP) . |
| 6-159433 | 6/1994 | (JP) . |
| 9-15868 | * 1/1997 | (JP) . |
| 2673321 | 9/1997 | (JP) . |
| 10-256141 | 9/1998 | (JP) . |

* cited by examiner

Primary Examiner—Daniel S. Larkin
Assistant Examiner—Rose M. Miller
(74) Attorney, Agent, or Firm—Fitzpatrick, Cella, Harper & Scinto

(57) ABSTRACT

An active vibration isolator includes a vibration isolation platform on which an object to be isolated from vibration is mounted, an air-spring actuator which supports the vibration isolation platform, the air-spring actuator including a valve, which is subjected to feedback drive, a vibration measurement device which measures vibration of the vibration isolation platform and outputs acceleration and velocity signals, a position measurement device which measures position of the vibration isolation platform and first, second and third feedback loops. The first feedback loop feeds back an output of a force measurement device, which measures a working force applied by the air-spring actuator to the vibration isolation platform, thereby controlling the working force supplied by the air-spring actuator. The second feedback loop has a PI compensator and signals of the vibration measurement device are fed back to an input side of the compensator, for producing damping and spring effects which act upon the platform. The third feedback loop feeds back an output from the position measurement device, thereby positioning the platform at a designated position.

19 Claims, 11 Drawing Sheets

FREQUENCY RESPONSE OF
TRANSMISSIBILITY

ACTIVE VIBRATION ISOLATOR, EXPOSURE APPARATUS, EXPOSURE METHOD AND DEVICE MANUFACTURING METHOD

BACKGROUND OF THE INVENTION

1. Field of the Invention

This invention relates to an active vibration isolator used in a semiconductor exposure apparatus, which burns a circuit pattern on a reticle into a wafer, an apparatus for manufacturing a liquid crystal substrate or an electron microscope. More specifically, the invention relates to an active vibration isolator capable of suppressing external vibration transmitted to a vibration isolation platform and of positively canceling out vibration produced by a precision instrument per se, such as a stage, mounted on a vibration isolation platform, as well as to an exposure apparatus, exposure method and device manufacturing method that employ this active vibration isolator.

2. Description of the Related Art

In an electron microscope which uses an electron beam or in a semiconductor exposure apparatus typified by a stepper or scanner, an XY stage is mounted on a vibration isolator. The vibration isolator functions to attenuate vibration by vibration absorption means such as an air spring, coil spring or vibration isolating rubber. However, a problem in such a passive vibration isolator having these vibration absorption means is that vibration produced by the XY stage itself, which is mounted on the isolator, cannot be attenuated effectively even though vibration transmitted from the floor can be attenuated to some extent. In other words, a reaction force produced by high-speed movement of the XY stage per se causes the vibration isolation platform to vibrate. This vibration causes a marked decline in the positioning stability of the XY stage. Another problem with the passive vibration isolator is that there is a performance tradeoff between isolation of vibration transmitted from the floor and suppression of vibration produced by the high-speed movement of the XY stage per se. In order to solve these problems, there has been a tendency in recent years to use active vibration isolators.

An active vibration isolator is equipped with a vibration control loop which detects and feeds back vibration of the vibration isolation platform, and a position control loop for orienting the vibration isolation platform at a predetermined location. The vibration control loop is the major feature of the active vibration isolator that distinguishes it from the passive vibration isolator. The active vibration isolator makes it possible to realize a sky-hook damper (electrical viscous damping) and a sky-hook spring (electrical spring). By way of example, the specification of Japanese Patent Application Laid-Open No. 6-159433 ("Active Vibration Isolation Method and Vibration Isolation Apparatus") describes a type of feedback for obtaining the effects of both a sky-hook damper and a sky-hook spring. This specification discloses a vibration isolator in which an air spring is adopted as an actuator and expresses a nominal model of the vibration isolation platform by the following equation:

$$P_n = \frac{K_v}{1+T_v s} \cdot \frac{A}{Ms^2 + Ds + K} \quad (1)$$

where $K_v$ represents the gain of a servo valve, $T_v$ the time constant of a pneumatic system which includes the servo valve and an air spring, M the mass of the vibration isolation platform, D the viscous damping coefficient of the air spring, and K the spring constant of the air spring.

The transfer function of the first-order time lag in the first factor on the right side of Equation (1) expresses the driving characteristic of the air spring, and the transfer function of the second-order time lag in the second factor on the right side of the equation expresses the transfer function of the mechanical system. The sky-hook damper effect is obtained by acceleration feedback and the sky-hook spring effect is obtained by velocity feedback. However, the specification of the above-mentioned laid-open application does not describe why the effects of the sky-hook damper and sky-hook spring are realized. The reason why the effects of the sky-hook damper and sky-hook spring are obtained resides in the fact that $T_v$ in Equation (1) actually is chosen to be sufficiently large, so that the transfer function of the first-order time lag of the first factor is substantially an integration characteristic. In other words, owing to acceleration feedback, a signal indicative of acceleration undergoes first-order integration in accordance with the integration characteristic of the actuator and becomes a dimension of velocity, and the manipulated variable with respect to the mechanical system acts as damping (viscosity). Similarly, when velocity feedback is performed, a dimension of position is obtained by the integration characteristic of the actuator and the manipulated variable with respect to the mechanical system acts as a spring. Accordingly, the sky-hook damper effect is obtained by acceleration feedback and the sky-hook spring effect is obtained by velocity feedback.

Most of the conventional active vibration isolators apply the manipulated variable to the support mechanism of the vibration isolation platform as damping by feeding back the output of the acceleration sensor, which is the typical vibration measurement means. That is to say, only the sky-hook damper effect is utilized. In order to maximize the performance of an active vibration isolator, the sky-hook spring effect should be utilized and not just the sky-hook damper effect. Active vibration isolators equipped with a sky-hook spring along with a sky-hook damper exclude active vibration isolators that use a piezoelectric element as the actuator and are considered to be non-existent at least among active vibration isolators that use an air spring as the actuator.

The sole example is disclosed in the specification of Japanese Patent No. 2673321 "Method and Circuit for Supporting Horizontal Position and Isolating Horizontal Vibration of Vibration Isolation Platform", which describes the construction of a control apparatus for applying PID compensation to the output of an acceleration sensor and driving a servo valve that regulates the inflow and output of air, which is the working fluid, to and from an air spring, where PID represents "proportional plus integral plus derivative". Though the specification does not use the terms sky-hook damper or sky-hook spring, in actuality the sky-hook damper effect is achieved by feeding back acceleration at a proportional gain P, and the sky-hook spring effect is achieved by feeding back an acceleration signal via an integrating gain I. It should be noted that if acceleration is fed back via a differentiating gain D, mass is increased.

When the output of the acceleration sensor is fed back via the integrating gain I, however, the full integration characteristic actually cannot be brought to bear in order to avoid drift. More specifically, since the integrator is one which involves low-cut processing, a significant sky-hook spring effect cannot be manifested and, in actual practice, only the sky-hook damper effect is used. That is, though the above-mentioned specification discloses a control apparatus which feeds back the output of an acceleration sensor via a PID compensator, meaningful effects are not obtained in regard to the integrating (I) operation and, hence, only the proportional (P) operation is realized.

Thus, most of the conventional active vibration isolators apply the manipulated variable to the support mechanism of the vibration isolation platform as damping by feeding back the output of the vibration measurement means (e.g., acceleration sensor). In other words, only the sky-hook damper is utilized. The superiority of the sky-hook damper with regard to a damping effect using a passive element is obvious. However, in order to realize the full potential of an active vibration isolator, the sky-hook spring effect should be manifested and not just the sky-hook changes effect.

SUMMARY OF THE INVENTION

Accordingly, an object of the present invention is to realize a significant sky-hook spring effect in addition to the sky-hook damper effect in an active vibration isolator that uses an air spring as the actuator, and in an exposure apparatus, exposure method and device manufacturing method that employ this vibration isolator.

According to a first aspect of the present invention, the foregoing object is attained by providing an active vibration isolator comprising: a vibration isolation platform on which an object to be isolated from vibration is mounted; an air-spring actuator for supporting the vibration isolation platform; vibration measurement means which measures vibration of the vibration isolation platform; position measurement means which measures position of the vibration isolation platform; a first feedback loop for feeding back output of force measurement means, which measures a working force applied by the air-spring actuator to the vibration isolation platform, thereby controlling the working force applied by the air-spring actuator; a second feedback loop for feeding back acceleration and velocity based upon an output from the vibration measurement means, thereby producing damping and spring effects which act upon the vibration isolation platform; and a third feedback loop for feeding back an output from the position measurement means, thereby positioning the vibration isolation platform at a designated position.

An exposure apparatus according to the present invention has a stage for holding a substrate and positioning the substrate at an exposure position, wherein the substrate positioned at the exposure position is exposed, the apparatus including the above-described active vibration isolator, which holds the stage.

An exposure method according to the present invention holds and positions a substrate at an exposure position by a stage and exposes the positioned substrate, wherein the stage is isolated from vibration by being mounted on the above-described active vibration isolator.

A device manufacturing method according to the present invention manufactures a device by holding and positioning a substrate at an exposure position by a stage and exposing the positioned substrate, wherein the stage is isolated from vibration by being mounted on the above-described active vibration isolator.

In accordance with the present invention, velocity that has been fed back undergoes integrating compensation in accordance with a satisfactory integration characteristic of a PI compensator relating to acceleration that has been fed back for producing a damping effect. As a result, a significant spring effect is obtained. Accordingly, more effective isolation of vibration is carried out.

A closed loop for obtaining acceleration and velocity outputs from the loop per se is constructed as the vibration measurement means. The closed loop can be one which produces the acceleration and velocity outputs simultaneously.

Thus, in accordance with the first aspect of the present invention, the sky-hook damper effect can be made to function as a matter of course, and a significant sky-hook spring effect can be realized as well.

In the vibration isolator according to the first aspect of the present invention, a velocity sensor is used instead of an acceleration sensor, which is employed in the field of vibration control, as the vibration measurement means. The reason for this is that whereas double integrations are required to obtain absolute displacement from the output of an acceleration sensor, only a single integration suffices to obtain absolute displacement from a velocity sensor.

Since the acceleration sensor used heretofore can be used as a tilt sensor as well, it was believed that theoretically the sensor possessed a sensitivity from direct current to the high-frequency region in which response is possible. In actuality, however, an acceleration sensor cannot readily sense an acceleration signal having an extremely low frequency. The reason for this is that acceleration of extremely low frequency is, in almost all cases, substantially non-existent in a structure subjected to vibration control. This means that an actual acceleration signal in this frequency region is noise. It is obvious that even if a signal containing a large amount of noise is integrated twice and fed back, a meaningful effect cannot be obtained. On the contrary, subjecting such a signal to double integrations and feeding it back will merely destabilize attitude control of the vibration isolation platform. In practical applications, therefore, an acceleration signal exhibiting drift in the low-frequency region is applied to a low-frequency cut-off filter so as to be excluded from use. In the case of the velocity sensor used in the first aspect of the present invention, on the other hand, velocity in the extremely low-frequency region is capable of being sensed much better in comparison with acceleration in this region and an absolute displacement signal obtained by a single integration also can be utilized as a significant feedback signal.

FIG. 8 illustrates the frequency response of transmissibility when the sky-hook spring effect is achieved by feeding back the output of a velocity sensor. In FIG. 8, a frequency characteristic indicated at A represents a case where there is no velocity feedback, and a frequency characteristic indicated at B represents a case where the same feedback is introduced. Owing to the velocity feedback, the transmissibility in the low-frequency region is less than 0 dB, and thus it will be understood that the sky-hook spring effect is achieved. The transmissibility in this frequency region is reduced. In an exposure apparatus incorporating such an active vibration isolator, therefore, the vibration specifications of the floor on which the apparatus is installed can be relaxed. In other words, even if the exposure apparatus is placed on a floor subjected to large vibration, a prescribed exposure precision can be assured. If the vibration level of the floor is the same as heretofore, using an active vibration isolator that exhibits the sky-hook spring effect in an exposure apparatus makes it possible to lower greatly the level of vibration transmitted to the structure of the exposure apparatus and, as a result, to carry out exposure of much higher precision.

Thus, achieving the sky-hook spring effect in an active vibration isolator is advantageous in that it contributes to higher precision and higher productivity in regard to the ICs manufactured by the exposure apparatus. However, there are cases where a phenomenon that can be thought of as drift is brought about as a result of performing measurement in a region of frequencies below the frequency characteristic of transmissibility shown in FIG. 8. More specifically, it has been clarified that when the output of the velocity sensor is fed back, the vibration isolation platform is caused to vibrate at an extremely low frequency. As a result of examining the cause, it has been clarified that the problem arises from the characteristic of the air spring in the low-frequency region. The frequency response from the command input to the servo valve that drives the air spring to the internal pressure of the air spring generally is an integration characteristic. On closer inspection, however, there is an error from the integration characteristic in the region of extremely low frequencies. In the region of high frequencies, there is an error from the integration characteristic, such as the occurrence of resonance caused by the resonating of piping for the supply and discharge of air. In other words, the integration characteristic is not perfect and can be described as being a pseudo-integration characteristic.

According to the first aspect described above, feedback of a working force is introduced to thereby compensate for the characteristic of the air-spring actuator, which characteristic is regarded as being a pseudo-integration characteristic. However, if the compensation does not reflect the characteristic of the air spring, the vibration isolation platform will be caused to vibrate in the low-frequency region when feedback for implementing the sky-hook spring effect is applied. Accordingly, the characteristic of the air-spring actuator is a pseudo-integration characteristic of the kind described above.

If it is attempted to obtain the sky-hook spring effect by performing velocity-signal feedback with respect to the pseudo-integration characteristic of the air-spring actuator, the sky-hook spring effect can be achieved in the low-frequency region even in a case where the structure of the control loop described in the first aspect of the invention is not employed. In such a case, however, the air spring departs from the integration characteristic in the region of extremely low frequencies. As a result, even if the velocity signal is fed back, not only is it impossible to realize the sky-hook spring effect but the vibration isolation platform also is caused to vibrate at extremely low frequencies. The error from the integration characteristic in the region of extremely low frequencies is one cause of instability, in which the vibration isolation platform is caused to vibrate when the sky-hook spring effect is achieved by this actuator.

A second object of the present invention is not to achieve the sky-hook spring effect by driving an air-spring actuator but to achieve the sky-hook spring effect by using an electromagnetic motor having a straightforward frequency characteristic relating to drive and using the output of a velocity sensor, with the focus being on an active vibration isolator that employs the electromagnetic motor together with an air spring.

According to a second aspect of the present invention, the second object is attained by providing an active vibration isolator comprising: a vibration isolation platform on which an object to be isolated from vibration is mounted; an electromagnetic motor having a plurality of active support legs for supporting the vibration isolation platform, in which each support leg drives the vibration isolation platform; and vibration measurement means which measures vibration of the vibration isolation platform, wherein a sky-hook spring effect is realized by driving the electromagnetic motor upon compensating for an output from the vibration measurement means appropriately. A velocity sensor is ideal for use as the vibration measurement means.

In a preferred embodiment of the second aspect of the invention, the vibration isolator further comprises an air-spring actuator and position measurement means, wherein positioning is carried out by driving the air-spring actuator upon compensating for an output from the position measurement means appropriately and a sky-hook damper effect (electrical viscosity) is realized, in addition to the sky-hook spring effect (electrical spring property), by driving the electromagnetic motor upon compensating for an output from the vibration measurement means appropriately. A stage for holding a substrate and positioning the substrate at an exposure position is mounted also on the active vibration isolator of this embodiment as well.

Thus, in a specific example of the second aspect of the present invention, rather than realizing a sky-hook spring effect that employs an air spring, a sky-hook spring effect is realized by driving and controlling an electromagnetic motor used in conjunction with an air spring. An electromagnetic motor does not possess a drive characteristic having complicated dynamics, namely a characteristic in which there is an error from an integration characteristic in a region of extremely low frequencies, unlike the case with the air-spring actuator. The drive-related frequency characteristic is flat from direct current to the high-frequency region. In other words, a stable sky-hook spring effect can be achieved by driving an electromagnetic motor having a straightforward drive characteristic based upon a signal obtained by suitably compensating for the output of a velocity sensor.

An active vibration isolator employing not only an air spring but also an electromagnetic motor (a linear motor or voice-coil motor) as an actuator has actually been placed in service. The strategy of such an active vibration isolator is role sharing. That is, the role of supporting the very heavy vibration isolation platform is assigned to the air spring, and the electromagnetic motor is used to rapidly suppress vibration of the vibration isolation platform. In this case, the electromagnetic motor generally operates as an actuator for applying damping to the support mechanism of the vibration isolation platform. Moreover, in order to suppress vibration of the vibration isolation platform ascribed to the driving reaction force produced by high-speed drive of a device, e.g., an XY stage, that has been mounted on the platform, the electromagnetic motor of the vibration isolator is subjected to feed-forward drive using information that prevails when the stage is driven at high speed (examples of the information being the target profile for driving the XY stage or the XY stage position, velocity and acceleration, etc.). An electromagnetic motor has a flat frequency characteristic from direct current to the high-frequency region and therefore is an actuator having a high degree of linearity. Realizing the sky-hook spring effect by an air spring utilizing the pseudo-integration characteristic of an air spring or upon applying compensation that takes this integration characteristic into account requires that the dynamic characteristic of an air spring be understood in detail. Though realizing the sky-hook spring effect using an air spring does not involve theoretical difficulties, problems are encountered when this technique is actually employed in industry. Nevertheless, recent active vibration isolators are equipped with an electromagnetic motor in addition to an air spring and using the electromagnetic motor to achieve the sky-hook spring effect is preferred in that it provides stable operation.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Preferred embodiments of the present invention will now be described in detail in accordance with the accompanying drawings.

First Embodiment

Figure 1:
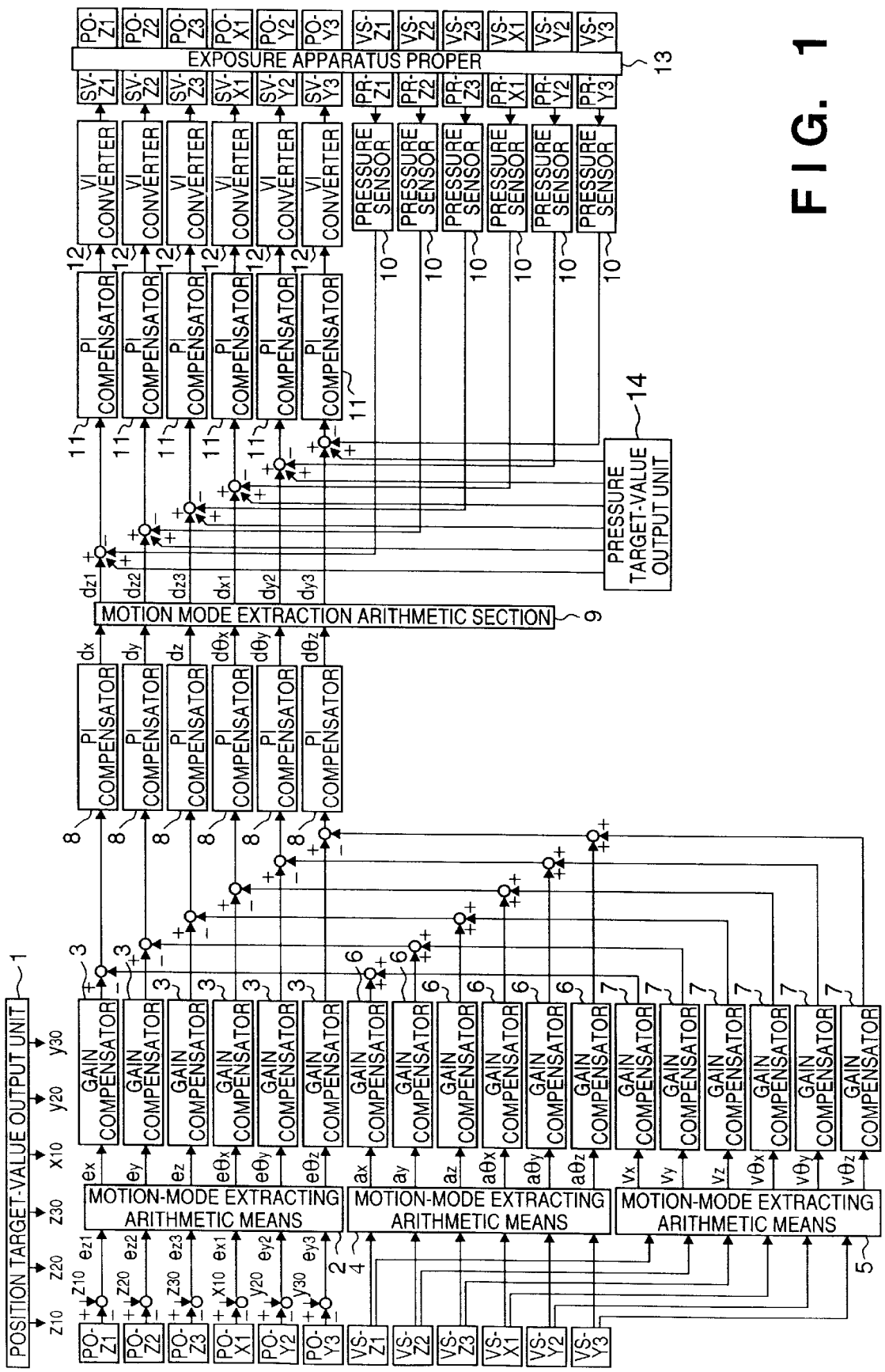
FIG. 1 is a block diagram illustrating an active vibration isolator according to a first embodiment of the present invention.

FIG. 1 illustrates the construction of an active vibration isolator according to a first embodiment of the present invention. Before particulars are described in accordance with FIG. 1, the principles of the invention will be described focusing on a single-axis active vibration isolator in order to facilitate an understanding of the invention.

Figures 2A, 2B:
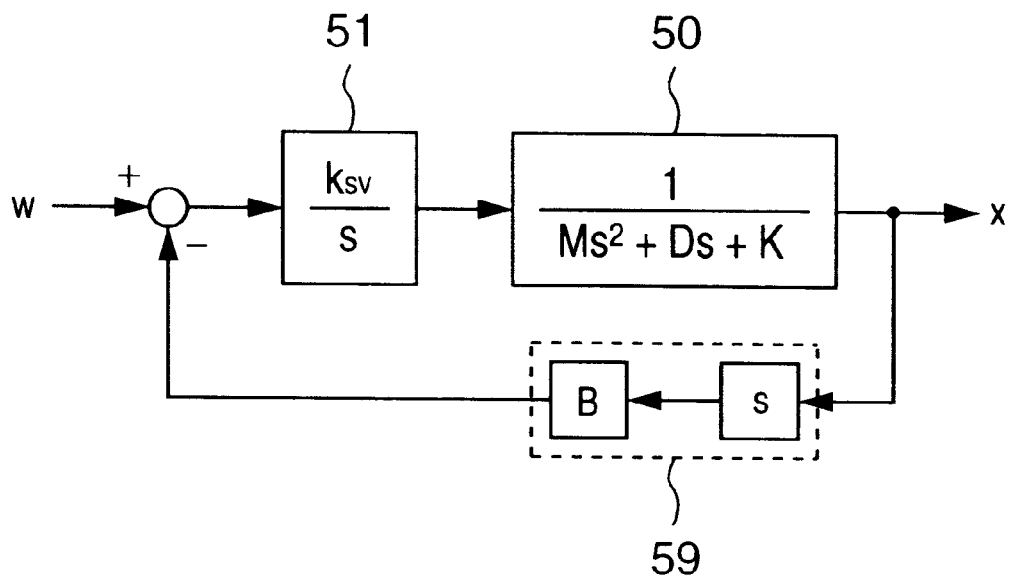
FIGS. 2A and 2B are diagrams illustrating the principles of a sky-hook spring.

First, FIGS. 2A and 2B are diagrams illustrating principles and are useful in describing the sky-hook spring effect, which is one goal of the present invention. In FIG. 2A, the transfer function of a mechanical system that includes a vibration isolation platform is indicated at 50, a transfer function indicating the characteristics of a servo valve and air spring is shown at 51, and a portion 59 enclosed by the dotted line represents velocity detection means. A transfer function from a drive input w to the servo valve to a displacement x of the vibration isolation platform is as follows according to simple calculation:

$$\frac{x}{w} = \frac{K_{sv}}{s} \cdot \frac{1}{Ms^2 + Ds + (K + BK_{sv})} \quad (2)$$

This is an equivalent block of the kind shown in FIG. 2B, where M represents the mass of the vibration isolation platform, D the viscous damping coefficient of the support mechanism of the vibration isolation platform, K the spring constant of the support mechanism (air spring, etc.) of the vibration isolation platform, $K_{SV}$ the gain from the input of a voltage-to-current converter, which drives the servo valve, to pressure produced by the air spring, B the gain of the velocity detection means, and s a Laplacian operator. It will be understood from Equation (2) that an electrical spring characteristic is applied by the gain B of velocity feedback. This is referred to as the sky-hook spring effect.

In an active vibration isolator which uses an air spring as an actuator, it may appear from Equation (2) that the sky-hook spring effect is obtained by velocity feedback. In reality, however, the sky-hook spring effect is not easy to realize. There are two problems. The first problem is the characteristic of the portion indicated at 51 in FIG. 2A, and the second problem is the characteristic of the velocity detection means 59.

The former problem will be described in detail first. In FIG. 2A, the characteristic of the transfer function 51 is made an integration characteristic of the gain $K_{sv}$. However, this merely expresses the fact that the characteristic can be approximated by such a characteristic. In actuality, the characteristic is one having a break point in the region of extremely low frequencies. In other words, the integration characteristic is not perfect. Accordingly, the strength of velocity feedback serving as a manipulated variable acting upon the vibration isolation platform via the incomplete integration characteristic does not act as a pure spring characteristic.

Figure 3:
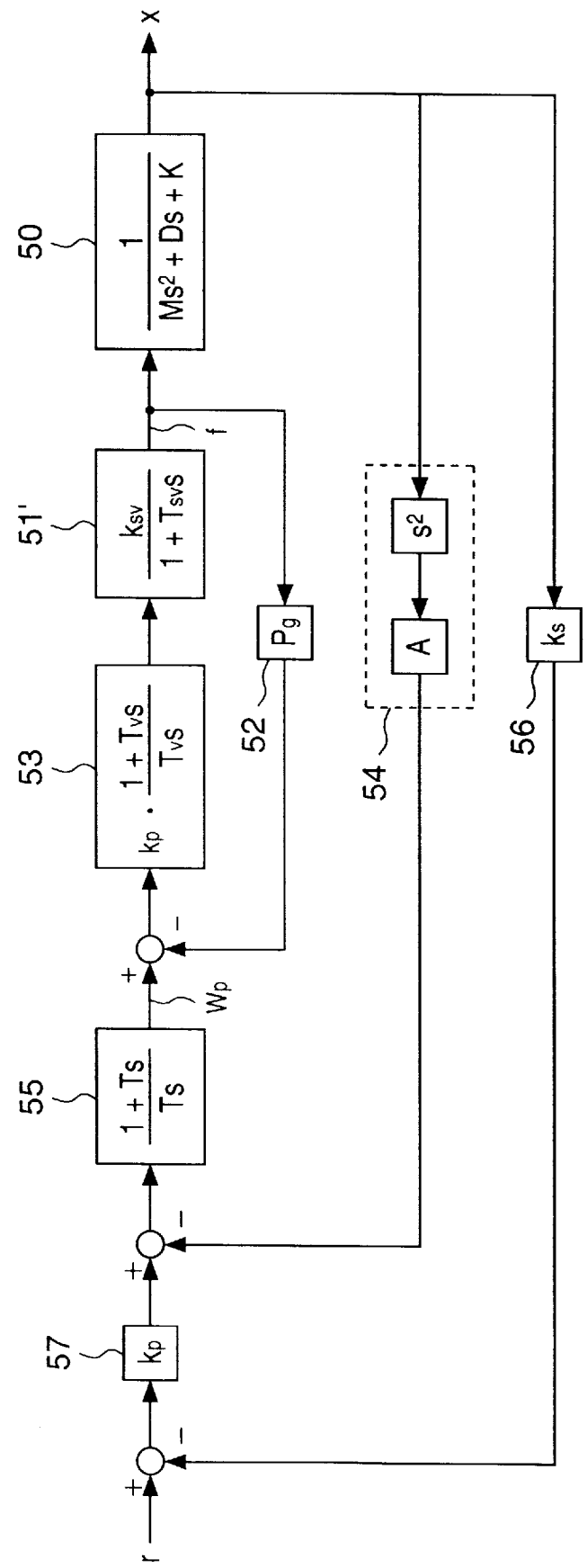
FIG. 3 is a block diagram of performing control according to the specification of Japanese Patent Application No. 9-68995.

In this embodiment, therefore, use is made of the art disclosed in the specification of Japanese Patent Application No. 9-68995, for which an application has been filed in the United States (Ser. No. 09/035,982), and the art disclosed in the specification of Japanese Patent Application Laid-Open No. 10-256141 ("Active Vibration Isolator"). FIG. 3 illustrates the control block thereof. In FIG. 3, numeral 51' denotes a transfer function from the input to a voltage-to-current converter, which drives the servo valve, to pressure produced by the air spring. The transfer function 51' of FIG. 3 is rewritten so as to express a characteristic closer to actuality in comparison with the transfer function 51. Numeral 52 denotes the gain $p_g$ of applied-pressure feedback. This applied pressure signifies a working force which the air-spring actuator applies to the vibration isolation platform and indicates either a force or the internal pressure of the air spring. In FIG. 3, force is detected and fed back at the gain $p_g$. Here, however, it is considered that the pressure within the air spring is detected and fed back at the gain $p_g$. Numeral 53 denotes a PI compensator relating to pressure. The time constant $T_v$ which decides the zero point thereof is selected so as to cancel out the poles of the transfer function 51'. When this is done, the characteristic from $w_p$ to f becomes a first-order time-lag characteristic.

Next, numeral 54 denotes an acceleration sensor having a gain A and serving as vibration measurement means. Feedback is applied to the input side of a PI compensator 55 relating to acceleration. Since acceleration feedback is applied to the integration characteristic of the PI compensator, damping can be applied to the support mechanism that supports the vibration isolation platform. Finally, position detected by position measurement means 56 having a gain $k_s$ is fed back to the input side of a gain compensator 57. Since the acceleration-related PI compensator 55 has an integrator, position feedback compensation is just gain $k_p$ and a steady-state position error will not be produced by this alone.

With the control loop arrangement shown in FIGS. 2A and 2B, there is no applied-pressure feedback of $p_g$, and acceleration feedback of gain A naturally is applied to the input side of the transfer function 51' in a state in which the PI compensator 53 relating to the applied pressure is non-existent. FIGS. 2A and 2B show a first-order time-lag characteristic of time constant $T_{sv}$, which is large and can be regarded substantially as an integration characteristic. Accordingly, damping can be applied in the required frequency band. If velocity feedback is applied in such an arrangement, it may appear that, in theory, the sky-hook spring effect can also be made to manifest itself. However, the sky-hook spring effect cannot be brought forth significantly owing to the incomplete integration constant of the transfer function 51' and the frequency characteristic of the velocity output.

In the control loop arrangement of FIG. 3, however, the acceleration-related PI compensator 55 is provided. The integration characteristic of this portion is not the ambiguous and incomplete characteristic of transfer function 51' and assures the implementation of a complete integration characteristic. In other words, if velocity feedback is applied to the input side of the acceleration-related PI compensator 55, it is possible for the sky-hook spring effect to manifest itself significantly.

Figure 4:
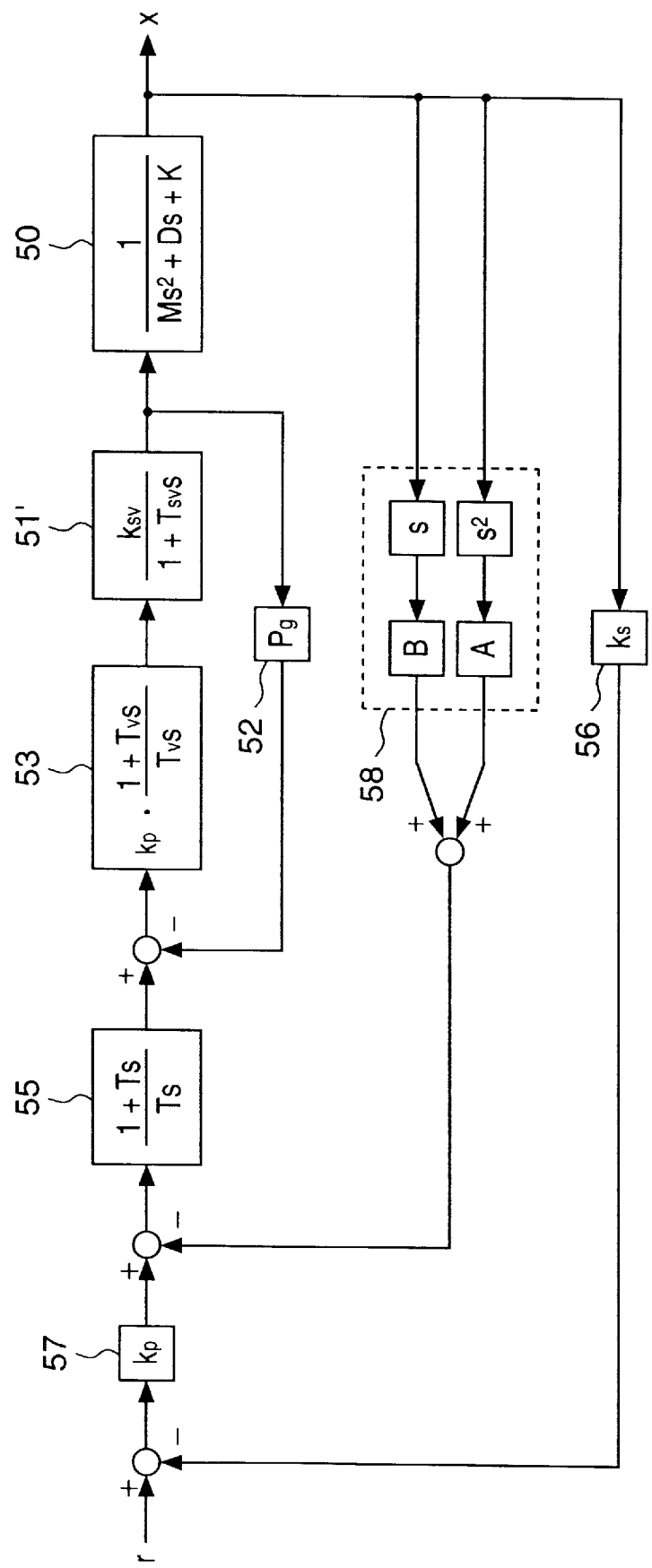
FIG. 4 is a block diagram of performing control according to the present invention.

Accordingly, if the arrangement according to the present invention is expressed along one axis, the result is as shown in FIG. 4. The arrangement of FIG. 4 positively exploits the fact that the acceleration-related PI compensator 55 is provided in FIG. 3. Here the output of vibration measurement means 58 which outputs a velocity signal along with an acceleration signal is fed back to the input side of the acceleration-related PI compensator 55. It goes without saying that the sky-hook damper effect is obtained by gain A and that the sky-hook spring effect is obtained by gain B. In the arrangement of FIG. 3, the sky-hook spring effect cannot manifest itself satisfactorily owing to the incomplete integration characteristic of the transfer function 51'. With the control loop arrangement of FIG. 4, however, the sky-hook spring effect can be achieved to a more significant extent by velocity feedback to the complete integration characteristic possessed by the acceleration-related PI compensator 55.

Figure 5:
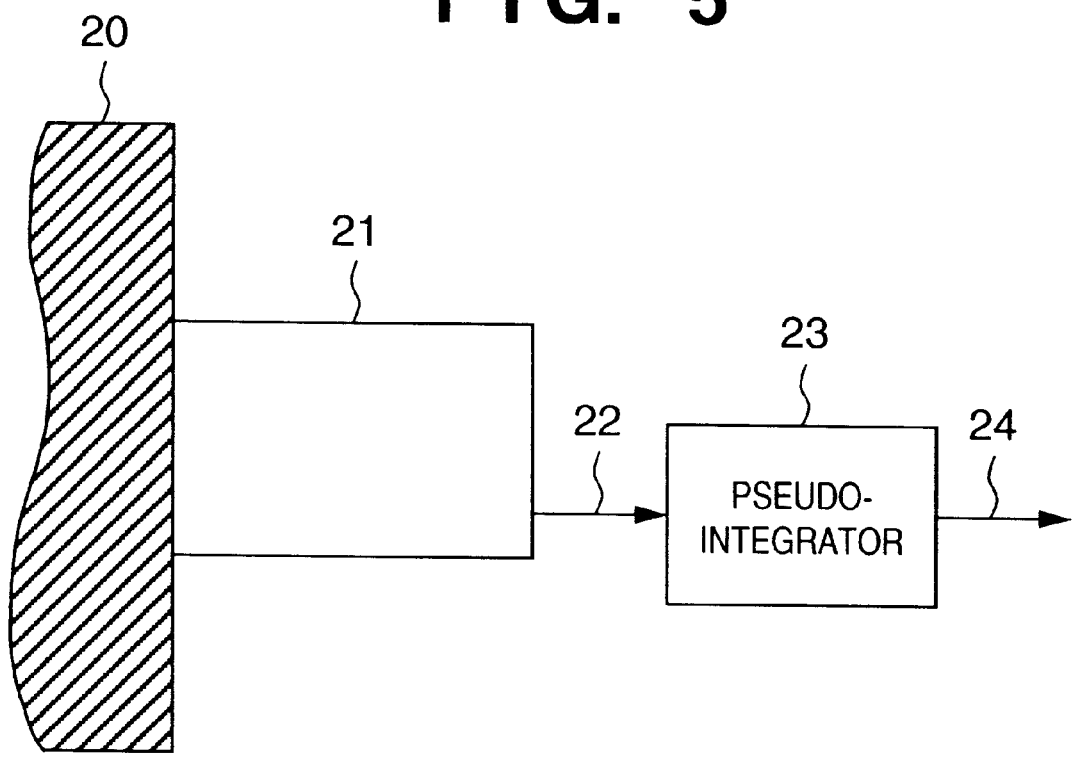
FIG. 5 is a diagram useful in describing velocity output using an acceleration sensor.

A second impediment to achieving a significant sky-hook spring effect is a problem relating to the quality of the output of the velocity detection means. The vibration measurement means 58 of FIG. 4 is a special device that outputs acceleration and velocity signals simultaneously. In general, however, the arrangement shown in FIG. 5 is adopted to obtain the velocity signal. When power is supplied to an acceleration sensor 21 mounted on an object 20 to be measured, acceleration produced by vibration of the object 20 is obtained at an acceleration output terminal 22. A velocity signal is obtained by applying the output of the acceleration output terminal 22 to a pseudo-integrator 23. Though the pseudo-integrator 23 should be a complete integrator, this is impossible in reality. In order to eliminate drift that appears at the acceleration output terminal 22, it is inevitable that an incomplete integration characteristic be used. Accordingly, the velocity signal obtained in the arrangement of FIG. 5 experiences degradation of its characteristic especially in the low-frequency region. Consequently, an attempt to obtain the sky-hook spring effect by feeding back the velocity signal obtained with the arrangement of FIG. 5 ends in failure.

According to this embodiment, therefore, vibration measurement means that provides a velocity signal whose low-frequency characteristic is not degraded is used instead of the arrangement of FIG. 5. The vibration measurement means is disclosed in the specification of Japanese Utility Model Publication No. 6-28698 ("Servo-type Vibration Receiver"). The sensor serving as this vibration measurement means is capable of outputting both acceleration and velocity signals at the same time.

Figure 6:
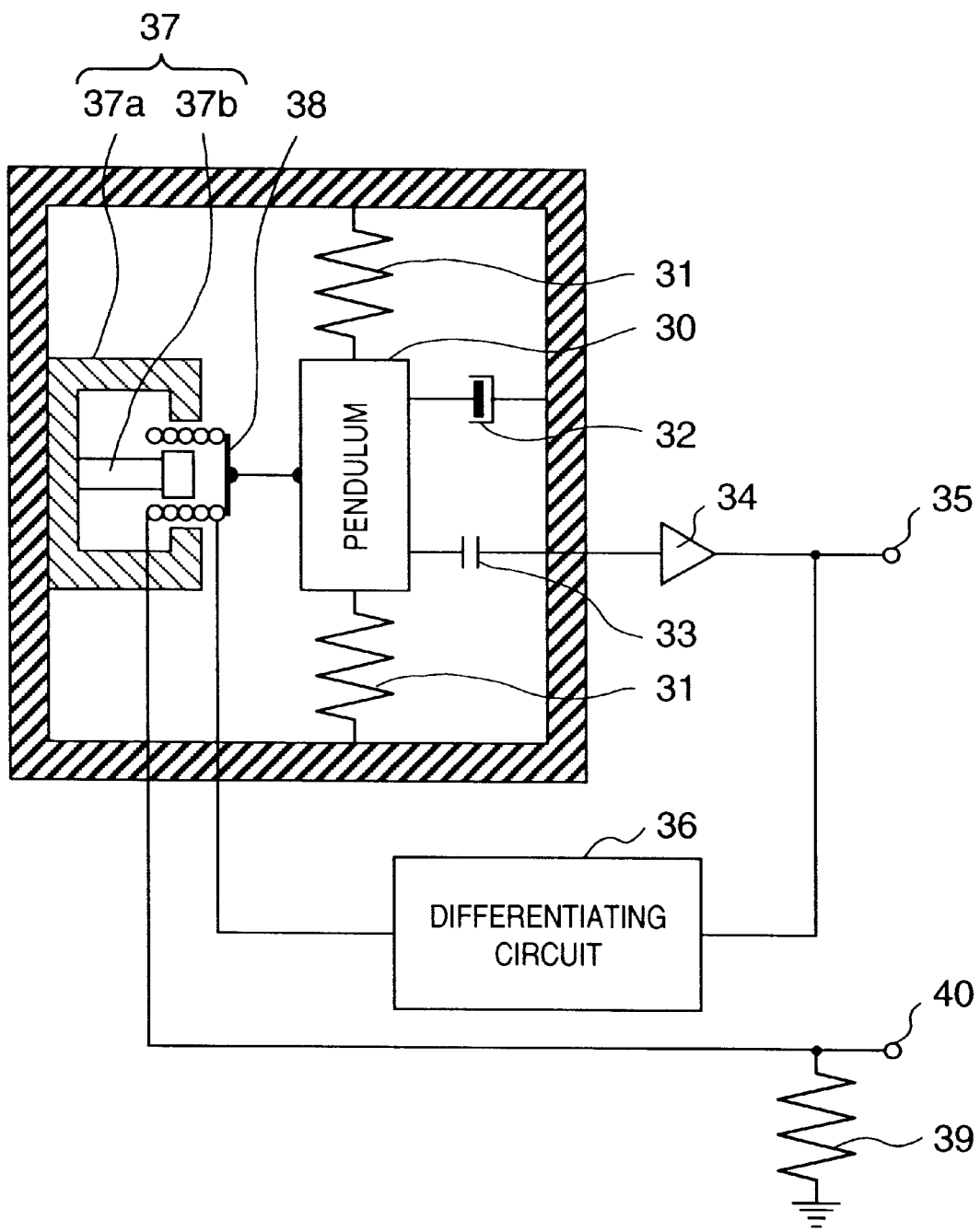
FIG. 6 is a servo-type vibration receiving device according to the specification of Japanese Utility Model Publication No. 6-28698.

FIG. 6 illustrates the detection principle. As shown in FIG. 6, a pendulum 30 is supported by a pair of supporting springs 31 and has an attenuator 32 connected to a portion thereof. The velocity component (an electrical signal) of vibration that acts upon the pendulum 30 is detected by a displacement detector 33 and output to a velocity output terminal 35 via an amplifier 34. In other words, among the vibration components that act upon the pendulum 30, velocity is detected and appears as an output at the velocity output terminal 35. The velocity output at the velocity output terminal 35 is supplied via a differentiating circuit 36 to a moving coil 38 of a movable element which constructs a drive unit 37. As a result, a restoration force corresponding to the magnitude of the differentiated output (current) of velocity acts upon the movable element, whereby a force that returns the pendulum 30 to the equilibrium position is obtained. The drive unit 37 comprises a cylindrical core 37a, a permanent magnet 37b provided at the center of the core, and the moving coil 38 serving as a movable element disposed in the magnetic path of the permanent magnet 37b. The output of the differentiating circuit 36 is supplied to a load resistor 39 as well. Accordingly, an acceleration signal is obtained at a terminal 40, which detects the voltage across the load resistor 39.

A closed loop for restoring the pendulum 30 to the equilibrium position is constructed by the vibration measurement means shown in FIG. 6. Velocity and acceleration signals can be detected from this loop simultaneously. If the closed loop of the vibration measurement means is stable, therefore, the low-frequency drift phenomenon is more stable in comparison with the method of velocity-signal detection shown in FIG. 5 and there is no deterioration in the frequency characteristic in the low-frequency region.

An active vibration isolator which incorporates the basic approach of the first aspect of the present invention has been described in regard to one axis. However, the vibration isolation platform generally employed in actual practice is supported by a plurality of active supporting legs and the degree-of-freedom of movement of the vibration isolation platform is thus controlled. The construction of an active vibration isolator for controlling the movement and attitude of a rigid body with six degrees-of-freedom through application of the technique according to the first aspect of the present invention will be described below.

Figure 7:
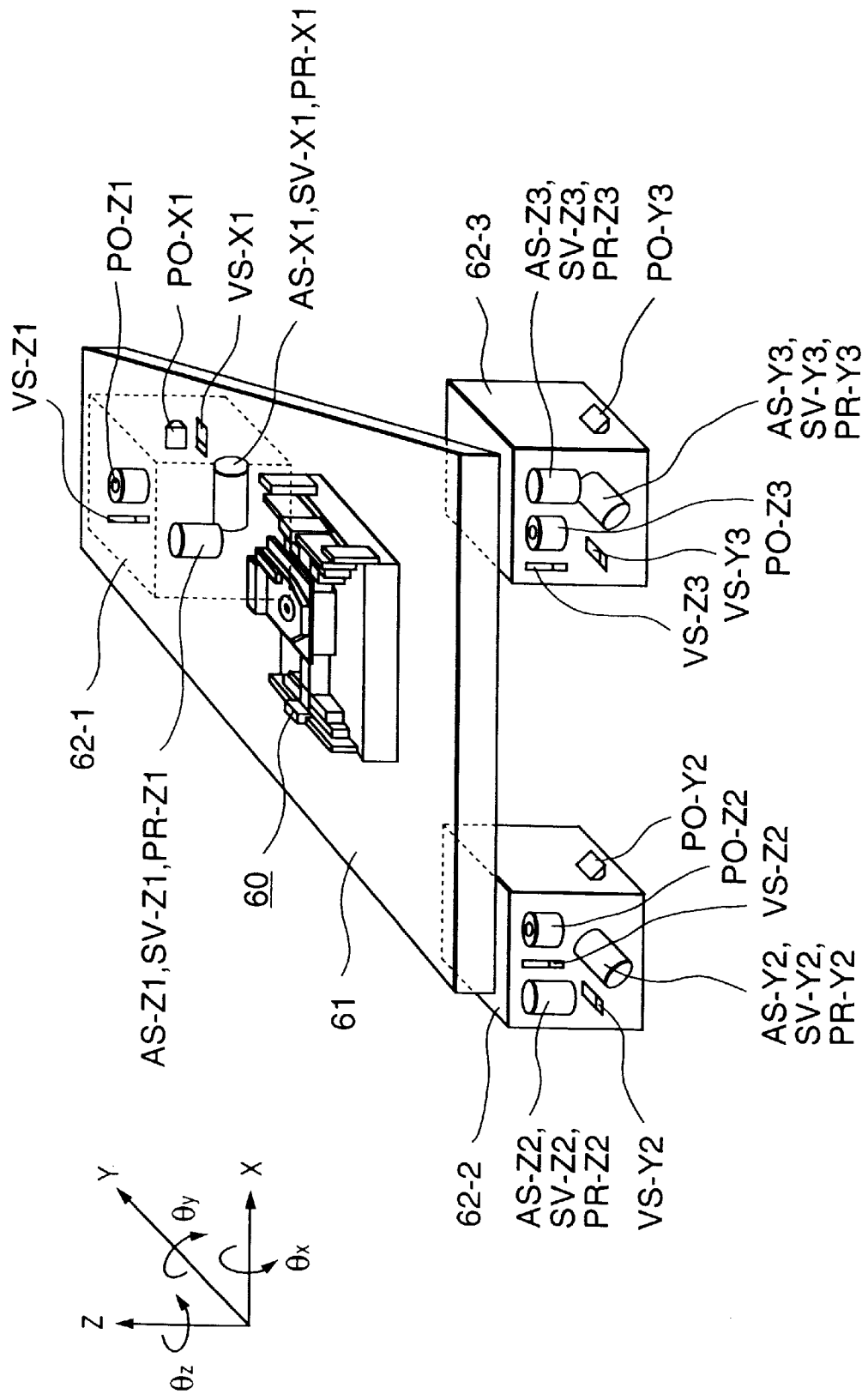
FIG. 7 is a diagram illustrating the mechanical structure of the active vibration isolator shown in FIG. 1.
Figure 8:
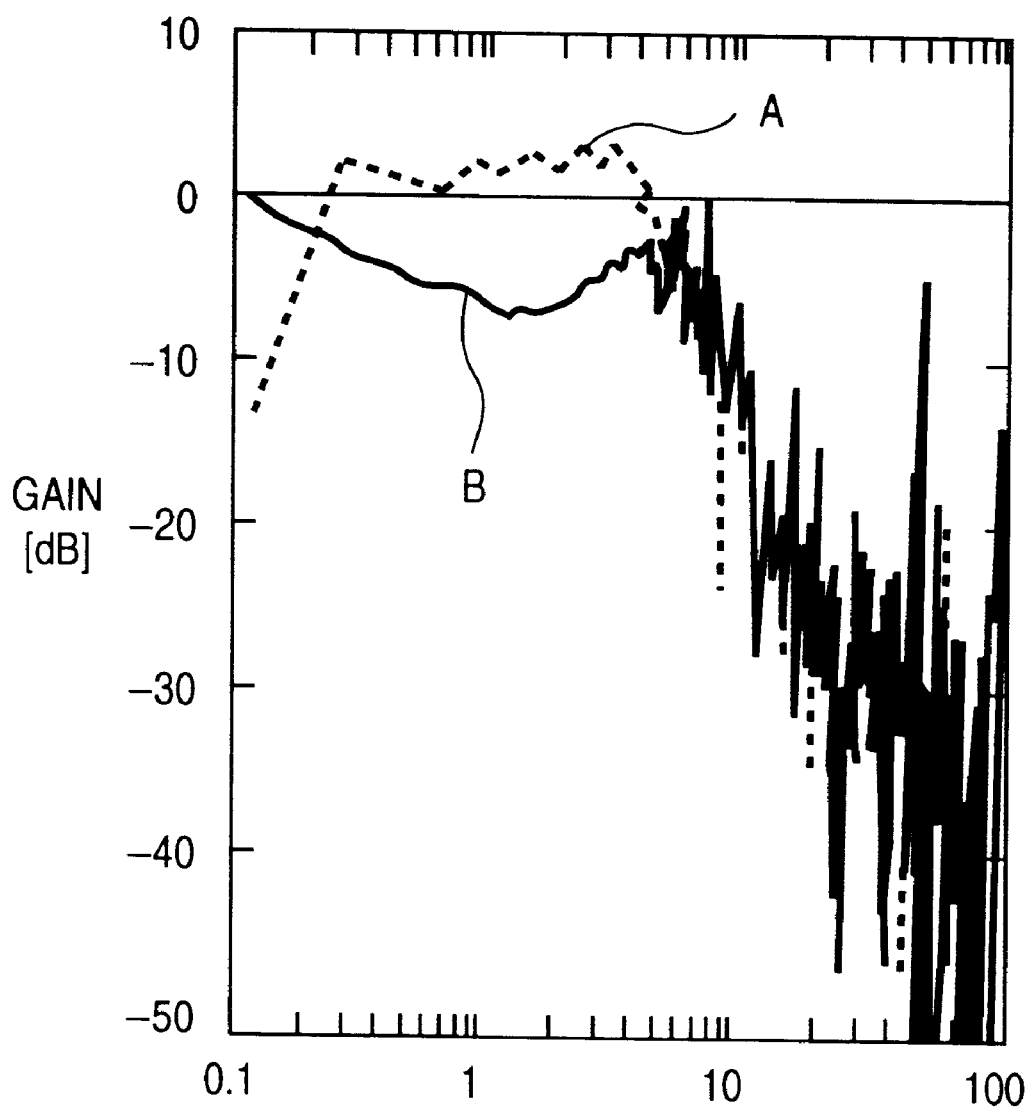
FIG. 8 is a diagram illustrating the frequency response of transmissibility in the active vibration isolator shown in FIG. 1.

FIG. 7 illustrates the mechanical structure of an active vibration isolator for controlling the movement and attitude of a generally triangular vibration isolation platform 61 with six degrees-of-freedom. As shown in FIG. 7, an XY stage 60 is mounted on the vibration isolation platform 61, which is supported by active supporting legs 62 (62-1, 62-2, 62-3). The active supporting legs 62 each have internal elements of a number necessary to control two axes, namely axes along the vertical and horizontal directions. These elements are vibration measurement means VS (VS-Z1, VS-Z2, VS-Z3, VS-X1, VS-Y2, VS-Y3) for outputting acceleration and velocity simultaneously; sensors PO (P0-Z1, PO-Z2, PO-Z3, P-X1, PO-Y2, PO-Y3) serving as position measurement means; pressure sensors PR (PR-Z1, PR-Z2, PR-Z3, PR-X1, PR-Y2, PR-Y3), servo valves SV (SV-Z1, SV-Z2, SV-Z3, SV-X1, SV-Y2, SV-Y3) and air-spring actuators AS (AS-Z1, AS-Z2, AS-Z3, AS-X1, AS-Y2, AS-Y3). The symbols that follow VS, PO, etc., indicate the directions in accordance with the illustrated coordinate system and the locations at which the active supporting legs 62 are situated. For example, Y2 indicates the direction along the Y axis and that the element is inside the active supporting leg 62-2 disposed on the left side.

This embodiment of the present invention will be described again with reference to FIG. 1. As shown in FIG. 1, the outputs of the position measurement means P0-Z1, PO-Z2, PO-Z3, P-X1, PO-Y2, PO-Y3 are compared with ($Z_{10}$, $Z_{20}$, $Z_{30}$, $X_{10}$, $Y_{20}$, $Y_{30}$), which are the outputs of a position target-value output unit 1, whereby position error signals ($e_{z1}$, $e_{z2}$, $e_{z3}$, $e_{x1}$, $e_{y2}$, $e_{y3}$) of the respective axes are obtained. These error signals are applied to motion-mode extracting arithmetic means 2, which is related to the position signal, for outputting motion-mode position-error signals ($e_x$, $e_y$, $e_z$, $e\theta_x$, $e\theta_y$, $e\theta_z$) of a total of six degrees-of-freedom concerning rectilinear motion of the vibration isolation platform 61 and rotational motion about the respective axes. These output signals are applied to gain compensators 3, which are related to position, for adjusting the position characteristic substantially incoherently for each motion mode. This loop is referred to as a position feedback loop.

Described next will be a feedback loop based upon outputs from the vibration measurement means VS-Z1, VS-Z2, VS-Z3, VS-X1, VS-Y2, VS-Y3. Here the vibration measurement means are sensors capable of sensing acceleration and velocity simultaneously. It has already been pointed out that this is a principle which differs from that in which a velocity signal is output in open fashion by directing an acceleration signal through an integrator ideally and through a pseudo-integrator in actuality.

First, the acceleration signal from the vibration measurement means VS is subjected as necessary to appropriate filtering processing such as processing for removing high-frequency noise, after which the processed signal is promptly input to motion-mode extracting arithmetic means 4, which is related to acceleration. The outputs of the motion-mode extracting arithmetic means 4 are motion-mode acceleration signals ($a_x$, $a_y$, $a_z$, $a\theta_x$, $a\theta_y$, $a\theta_z$). A velocity signal, which is one more output from the vibration measurement means VS, is subjected as necessary to appropriate filtering processing such as processing for removing high-frequency noise, after which the processed signal is input to motion-mode extracting arithmetic means 5, which is related to velocity. The outputs of the motion-mode extracting arithmetic means 5 are motion-mode velocity signals ($v_x$, $v_y$, $v_z$, $v\theta_x$, $v\theta_y$, $v\theta_z$).

In order that optimum damping may be set for each motion mode, the motion-mode acceleration signals ($a_x$, $a_y$, $a_z$, $a\theta_x$, $a\theta_y$, $a\theta_z$) are applied to gain compensators 6, which are related to the acceleration signals. The optimum damping characteristic is obtained for each motion mode by adjusting the gain. At the same time, the motion-mode velocity signals ($v_x$, $v_y$, $v_z$, $v\theta_x$, $v\theta_y$, $v\theta_z$) are applied to gain compensators 7, which are related to the velocity signals, in order to set the optimum spring characteristic for each motion mode. The sky-hook spring effect can be implemented for each motion mode by adjusting the gain. Next, the outputs of the gain compensators 6 and the outputs of the gain compensators 7 are added on a per-motion-mode basis and the sums are fed back to the input side of PI compensators 8, which is related to acceleration. This feedback loop is referred to as an acceleration/velocity feedback loop.

Signals obtained by adding the negative feedback signals of the acceleration/velocity feedback loop to the outputs of the above-mentioned gain compensators 3 are directed through the PI compensators 8 and become motion-mode drive signals ($d_x$, $d_y$, $d_z$, $d\theta_x$, $d\theta_y$, $d\theta_z$). In order to obtain a driving force to be generated by the actuator of each axis, the motion-mode drive signals are applied to motion-mode distribution arithmetic means 9, the outputs of which are drive signals ($d_{z1}$, $d_{z2}$, $d_{z3}$, $d_{x1}$, $d_{y1}$, $d_{y2}$) for each axis. These drive signals become the inputs to an applied-pressure feedback loop implemented for each axis. The principle of the applied-pressure feedback loop has already been described in conjunction with FIG. 3. To restate the arrangement in brief, the outputs of the pressure measurement means PR for measuring the internal pressure of the air spring are introduced to pressure sensing means 10, which apply suitable amplification and filtering for removal of high-frequency noise, and the outputs of the pressure sensing means 10 are fed back to the input side of PI compensators 11, which are related to pressure. The zero point of the PI compensator is selected so as to cancel out poles in the low-frequency region of the transfer characteristic from the input of a voltage-to-current converter (indicated by "VI converter" in FIG. 1) 12, which is for opening and closing the servo valve SV, to the internal pressure of the air spring. The characteristic from the drive signal ($d_{z1}$, $d_{z2}$, $d_{z3}$, $d_{x1}$, $d_{y1}$, $d_{y2}$) of each axis to the internal pressure of each air spring is a first-order time-delay characteristic. In other words, this is an orientation system. It should be noted that a pressure target-value output unit 14 applies a bias voltage for deciding neutral pressure of the air-spring actuator to the input side of the PI actuators 11 relating to pressure.

In the applied-pressure feedback loop described above, the internal pressure of the air-spring actuator is sensed by the pressure measurement means PR, which is typified by a pressure sensor, and a signal representing the sensed pressure is fed back. However, a function similar to that of the above-mentioned applied-pressure feedback loop can be implemented even when load feedback is adopted, in which the load produced by the air-spring actuator is sensed by load measurement means, which is typified by a load sensor, and the output of this sensor is fed back as negative feedback. In this embodiment, the technical content has been described using a pressure feedback loop which is one type of applied-pressure feedback loop.

Finally, the structural characteristics of a control apparatus according to this embodiment will be summarized.

(1) To realize the sky-hook spring effect in the prior art, use is made of the fact that the characteristic from the drive input of a servo valve to the force produced by an air spring is generally an integration characteristic. That is, when an acceleration signal is fed back to the input side of a voltage-to-current converter, which is for opening and closing the servo valve, the characteristic which includes the servo valve and the air spring is generally an integration characteristic, as a result of which a force that damps vibration of the vibration isolation platform is produced.

(2) However, the characteristic from the servo valve to the force produced by the air spring is merely an integration characteristic overall and is not a perfect integration characteristic. There is a departure from the integration characteristic especially in the region of extremely low frequencies.

(3) For this reason, it is desired to obtain a velocity signal by integrating the acceleration signal a single time. However, a low-cut filter must be introduced to deal with drift. As a result, the frequency characteristic for the velocity signal is degraded and the velocity signal gives rise to a manipulated variable via the imperfect integration characteristic produced by the servo valve and air spring. The sky-hook spring effect, therefore, cannot manifest itself.

(4) According to the active vibration isolator of this embodiment, however, the application of applied-pressure feedback is accompanied by the insertion of a PI compensator having a perfect integration characteristic. Velocity and acceleration are fed back to the input side of this PI compensator. As a result, owing to the perfect integration characteristic of the PI compensator, feedback of acceleration can act as damping and feedback of velocity can act as a spring.

(5) In addition, instead of adopting, as vibration measurement means for outputting a velocity signal, an arrangement in which the output of an acceleration sensor is integrated a single time to detect velocity, an arrangement is adopted in which the vibration measurement means itself constructs a closed loop for signal detection so that acceleration and velocity can be detected from this loop simultaneously.

Second Embodiment

Figure 9:
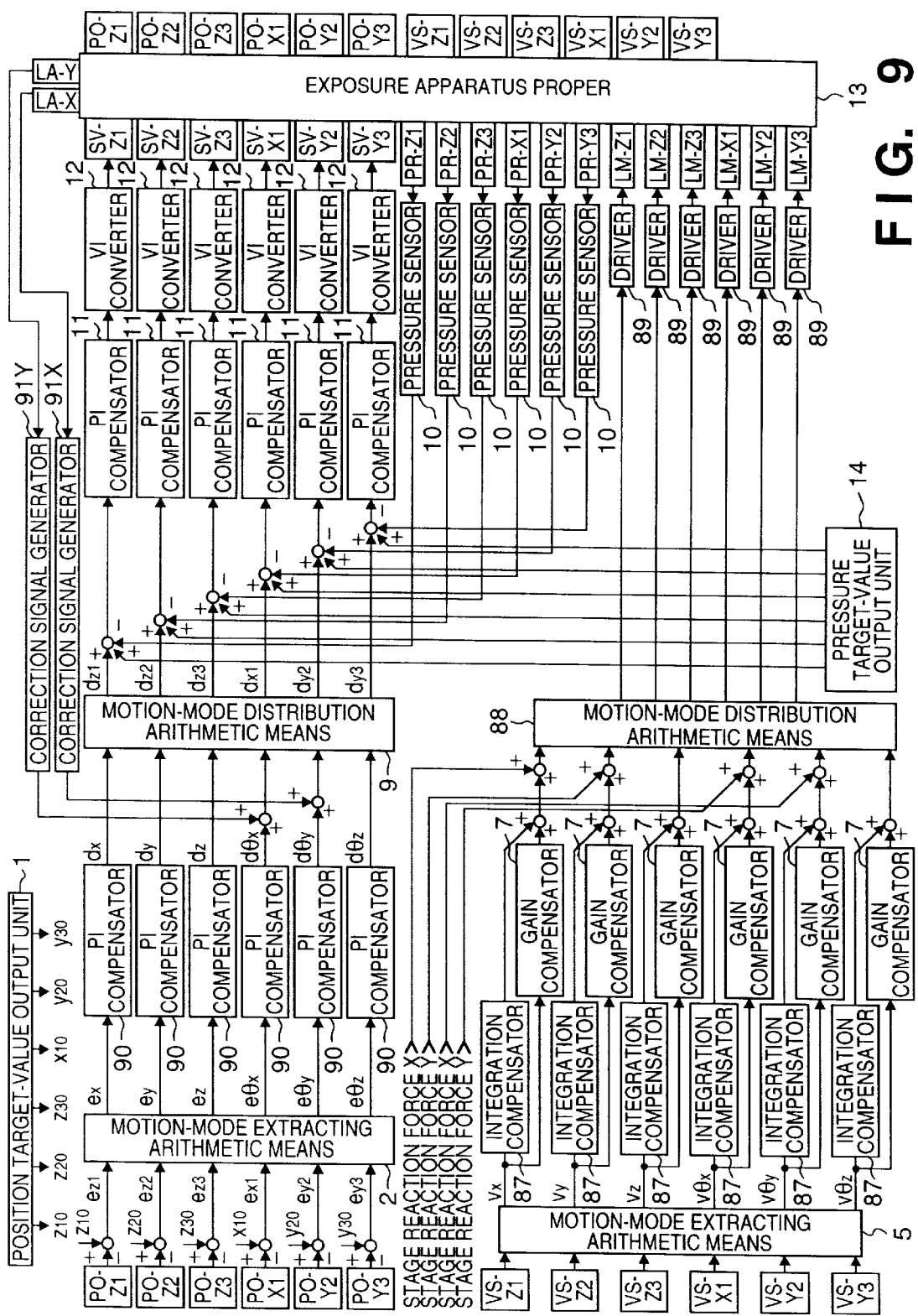
FIG. 9 is a block diagram illustrating an active vibration isolator according to a second embodiment of the present invention.

FIG. 9 illustrates the construction of an active vibration isolator according to a second embodiment of the present invention. The basic construction of the main control system in FIG. 9 is essentially the same as that shown in FIG. 7.

The active vibration isolator according to this embodiment is equipped with electromagnetic motors LM besides the air-spring actuators AS. The electromagnetic motors (referred to as "linear motors" below) LM-Z1, LM-Z2, LM-Z3, LM-X1, LM-Y1, LM-Y2, which are not shown in FIG. 7, are provided for positioning and orientation in the same manner as the air-spring actuators AS. According to this embodiment, the sky-hook spring effect is achieved by driving the linear motors LM instead of the air-spring actuators. The active vibration isolator of this embodiment is of the so-called hybrid type that makes joint use of air-spring actuators and electromagnetic motors.

Discussed first will be the control strategy of this hybrid-type active vibration isolator that makes use of both air-spring and electromagnetic-motor actuators. An air-spring actuator is capable of readily supporting a heavy object but has a slow response. An electromagnetic motor, on the other hand, has a high-speed response but a large current must be passed through it in order to support a heavy object and this makes necessary a large-capacity driving amplifier and measures for dealing with the evolution of heat. In other words, using an electromagnetic motor for the purpose of supporting a heavy object is not appropriate but an electromagnetic motor is suited to the transient generation of a high-speed, large thrust. Accordingly, with the hybrid-type active vibration isolator, a vibration isolation platform having a large mass is positionally controlled by air-spring actuators. The weakness of damping of the mechanism that supports the vibration isolation platform is compensated for and vibration of the vibration isolation platform, which is produced by a driving reaction force ascribable to high-speed positional drive of a device (e.g., an XY stage) mounted on the platform, is fed back to the electromagnetic motors that drive the vibration isolation platform using the platform drive signal, thereby suppressing the vibration early on. More specifically, in the hybrid active vibration isolator, the air-spring actuators are used to control position and the electromagnetic motors are used for velocity control and as actuators for feed-forward drive. Vibration control using the electromagnetic motors has the role of applying damping in the case of the prior art and is referred to as sky-hook damping in the field of vibration control. In this embodiment, the sky-hook spring effect also is implemented in addition to the sky-hook damping effect by using the electromagnetic motors. In regard to realizing the sky-hook spring effect, use of a velocity sensor is essential to detect vibration.

FIG. 9 illustrates the active vibration isolator according to this embodiment. Components in FIG. 9 identical with those shown in FIG. 1 are designated by like reference characters and need not be described again. In FIG. 9, the vibration measurement means VS outputs only velocity. The outputs of the velocity sensors VS are input to the motion-mode extracting arithmetic means 5, the outputs of which are the motion-mode velocity signals ($v_x$, $v_y$, $v_z$, $v\theta_x$, $v\theta_y$, $v\theta_z$) relating to velocity. These signals are input to the gain compensator 7, which is for adjusting damping for each motion mode. At the same time, the motion-mode velocity signals ($v_x$, $v_y$, $v_z$, $v\theta_x$, $v\theta_y$, $v\theta_z$) relating to velocity are input also to integration compensators 87, which are for calculating absolute displacement from velocity. An electrical spring effect (sky-hook spring effect) can be applied for each of the motion modes by adjusting the gains of the integration compensators 87. The outputs of the gain compensators 7 for adjusting damping on a per-motion-mode basis and the outputs of the integration compensators 87 for adjusting the spring property on a per-motion-mode basis are added and the outputs are input to motion-mode distribution arithmetic means 88 in order to generate signals that drive the linear motors LM. The outputs of the arithmetic means 88 are input to drivers 89, which feed currents to the linear motors LM.

Thus, with the active vibration isolator according to this embodiment, the outputs of the velocity sensors VS are converted to absolute displacement via the integration compensators 87 and driving forces responsive to these absolute displacements are produced by the linear motors LM. In the apparatus of FIG. 1, velocity and acceleration are output simultaneously as outputs of the vibration measurement means VS and the velocity output is fed back to the input side of the PI compensators 8 via the motion-mode extracting arithmetic means 5 and gain compensators 7, thereby causing the sky-hook spring effect to manifest itself. If the parameters of the PI compensators 8 relating to pressure are not set upon taking into account accurately the frequency characteristic from the input of the voltage-current converters 12 to the internal pressure of the air-spring actuators (namely the outputs of the pressure sensors PR), not only will this make it impossible to achieve the sky-hook spring effect satisfactorily but it will also lead to unstable behavior. According to this embodiment, however, the sky-hook spring effect is obtained by driving the linear motors LM having the straightforward frequency characteristic relating to drive, and stable operation can be realized.

It should be noted that the linear motors LM implement both the sky-hook damper and sky-hook spring functions and also have a feed-forward drive function.

Addition terminals are provided on the input side of the motion-mode distribution arithmetic means 88 in FIG. 9. The motion modes of the portion provided with these terminals are rectilinear along the x axis, rectilinear along the y axis, rotational about the x axis and rotational about the y axis. This is to suppress vibration of the vibration isolation platform 61 produced by the driving reaction force of the XY stage 60 mounted on the vibration isolation platform 61 in FIG. 7. When the XY stage 60 is driven along the x axis, the vibration isolation platform 61 moves rectilinearly along the x axis and also undergoes rotational motion about the y axis. Accordingly, x-axis driving information concerning the XY stage 60 is processed appropriately (see FIG. 1) and the processed information is added, as the stage reaction force x, to the portions of the x-axis rectilinear motion mode and rotational motion mode for rotation about the y axis on the input side of the motion-mode distribution arithmetic means 88. In other words, the processed information is fed forward.

Similarly, when the XY stage 60 is driven along the y axis, the vibration isolation platform 61 moves rectilinearly along the y axis and also undergoes rotational motion about the x axis. Accordingly, driving information of the XY stage 60 along the y axis thereof is processed appropriately (see FIG. 1) and the processed information is fed forward, as the stage reaction force y, to the portions of the y-axis rectilinear motion mode and rotational motion mode for rotation about the x axis on the input side of the motion-mode distribution arithmetic means 88. Vibration of the vibration isolation platform 61 caused by the driving reaction force of the XY stage can be suppressed by such feedback. A signal relating to the driving reaction force of the XY stage may be the driving signal of the XY stage or a signal obtained by performing an arithmetic operation based upon the driving signal of the XY stage.

Further, in the active vibration isolator of this embodiment, the functions of the sky-hook damper and sky-hook spring are implemented by driving the linear motors LM. The air-spring actuators, therefore, merely perform the function of position control. Accordingly, the acceleration-related PI compensators 8 in FIG. 1 are unnecessary and PI compensators for obtaining a position error of zero in the steady state are required instead of the position-related gain compensators 3. In other words, PI compensators relating to position are provided in FIG. 9.

Furthermore, in the active vibration isolator of this embodiment, the vibration isolation platform 61 inclusive of the XY stage 60 is supported by the active supporting legs 62. When the movable element of the XY stage 60 is moved for positioning, the vibration isolation platform 61 tilts owing to movement of the center of gravity of the vibration isolation platform 61 inclusive of the XY stage 60. Since this tilting is a disturbance as far as high-speed, high-precision positioning of the XY stage 60 is concerned, air-spring actuators function to correct this tilting of the vibration isolation platform 61. More specifically, tilting or inclination of the vibration isolation platform 61 is corrected by driving the air-spring actuators AS within the active supporting legs 62 based upon outputs from a laser interferometer LA-X (see FIG. 9), which measures the position of the XY stage along the x axis, and a laser interferometer LA-Y (see FIG. 9), which measures the position of the XY stage along the y axis. The output of the laser interferometer LA-X is applied to a correction signal generator 91X, which produces a signal proportional to the amount of movement of the XY stage 60 along the X axis from a reference position. This signal is added to motion-mode drive signal $d\theta_y$, which is for controlling the rotational position of the vibration isolation platform 61 about the y axis. As a result of this feedback, rotation of the vibration isolation platform 61 about the y axis is suppressed in conformity with the amount of movement of the movable element of XY stage 60 along the x axis.

Similarly, the output of the laser interferometer LA-Y is applied to a correction signal generator 91Y, which produces a signal proportional to the amount of movement of the XY stage 60 along the Y axis from a reference position. This signal is added to motion-mode drive signal $d\theta_x$, which is for controlling the rotational position of the vibration isolation platform 61 about the x axis. As a result of this feedback, rotation of the vibration isolation platform 61 about the y axis is suppressed in conformity with the amount of movement of the movable element of XY stage 60 along the y axis.

Finally, in the embodiment of FIG. 9, a working-force feedback loop is provided. However, the active vibration isolator may be one not having the pressure sensors PR, pressure sensing means 10 and pressure-related PI compensators 11, i.e., one not having the applied-pressure feedback loop.

<Embodiment of Device Manufacturing Method>

An embodiment of a device manufacturing method that is capable of using an exposure apparatus according to the present invention will now be described.

Figure 10:
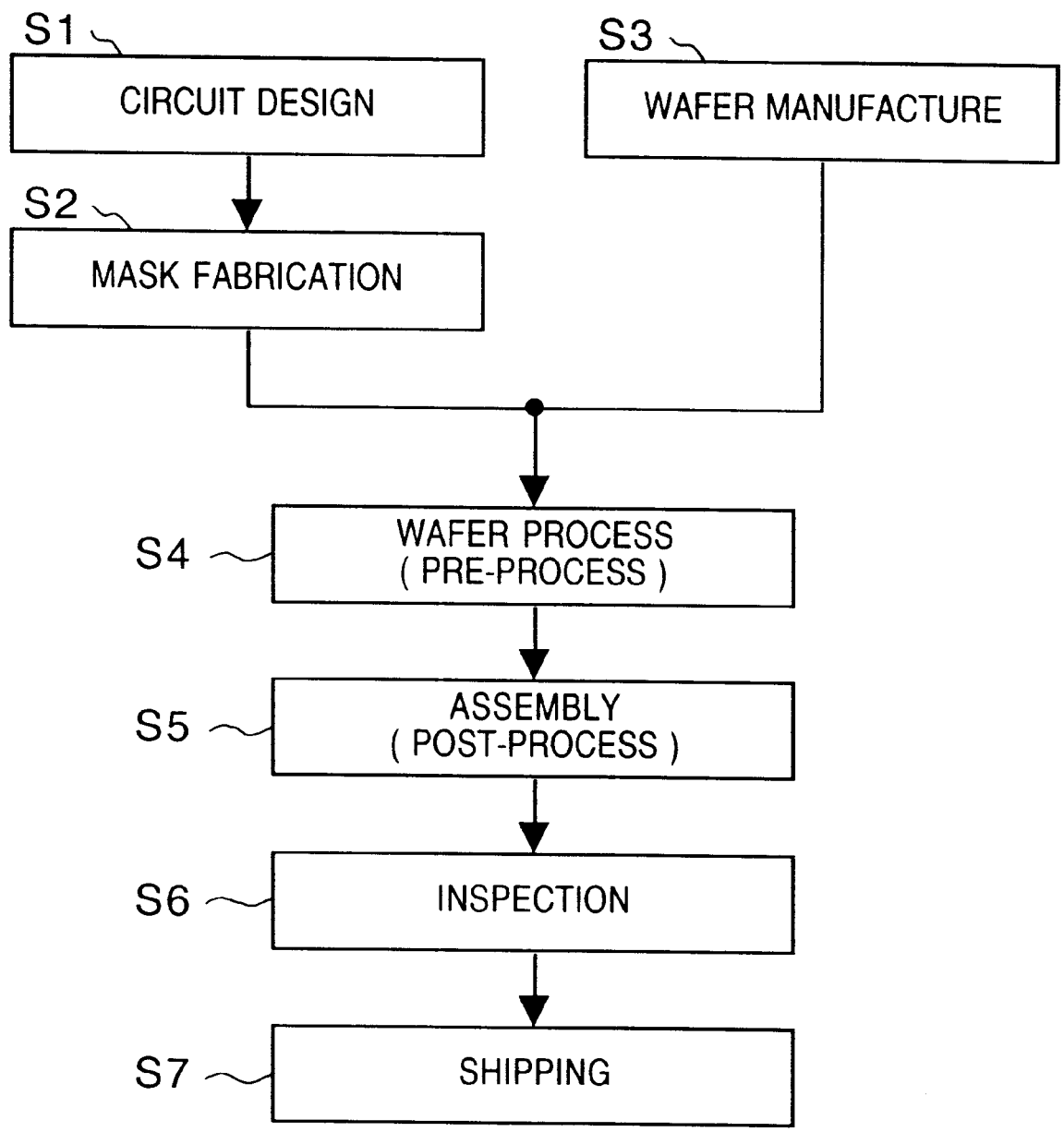
FIG. 10 is a flowchart illustrating a device manufacturing method capable of utilizing an exposure apparatus according to the present invention.

FIG. 10 is a diagram showing the flow of manufacture of a microdevice (a semiconductor chip such as an IC or LSI chip, a liquid crystal panel, a CCD, a thin-film magnetic head, a micromachine, etc.). The pattern for the device is designed at step S1 (circuit design). A mask on which the designed circuit pattern has been formed is fabricated at step S2 (mask fabrication). Meanwhile, a wafer is manufactured using a material such as silicon or glass at step S3 (wafer manufacture). The actual circuit is formed on the wafer by lithography, using the mask and wafer that have been prepared, at step S4 (wafer process), which is also referred to as a "pre-process". A semiconductor chip is obtained, using the wafer fabricated at step S4, at step S5 (assembly), which is also referred to as a "post-process". This step includes steps such as actual assembly (dicing and bonding) and packaging (chip encapsulation). The semiconductor device fabricated at step S5 is subjected to inspections such as an operation verification test and a durability test at step S6 (inspection). The semiconductor device is completed through these steps and then is shipped (step S7).

Figure 11:
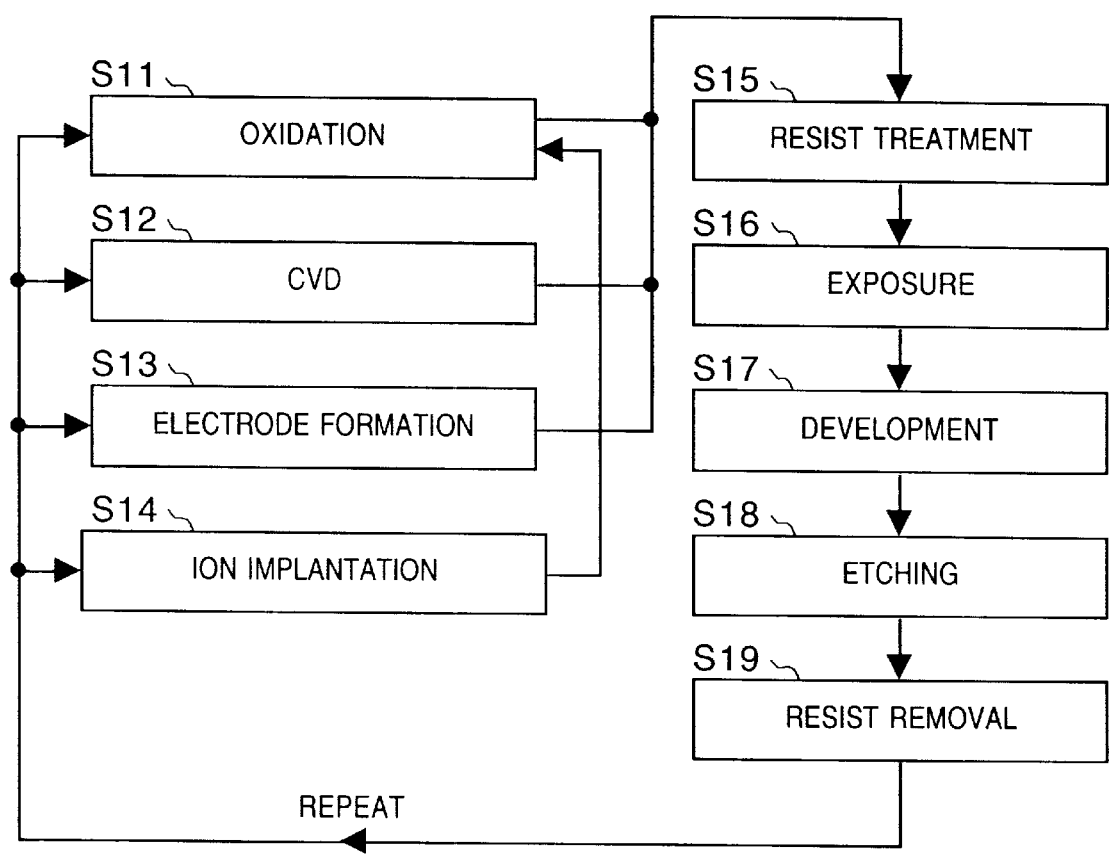
FIG. 11 is a flowchart showing the details of a wafer process in FIG. 10.

FIG. 11 is a flowchart illustrating the detailed flow of the wafer process (step 4) mentioned above. The surface of the wafer is oxidized at step S11 (oxidation). An insulating film is formed on the wafer surface at step S12 (CVD), electrodes are formed on the wafer by vapor deposition at step S13 (electrode formation), and ions are implanted in the wafer at step S14 (ion implantation). The wafer is coated with a photoresist at step S15 (resist treatment), the wafer is exposed to the circuit pattern of the mask to print the pattern onto the wafer by the above-described projection exposure apparatus at step S16 (exposure), and the exposed wafer is developed at step S17 (development). Portions other than the developed photoresist are etched away at step S18 (etching), and unnecessary resist left after etching is performed is removed at step S19 (resist removal). Multiple circuit patterns are formed on the wafer by implementing these steps repeatedly.

If the production process of this embodiment is employed, large devices can be manufactured at low cost. The manufacture of such devices using the prior-art techniques was difficult.

The effects of the present invention will now be described.

(1) The transmissibility, in the region of extremely low frequencies, of an active vibration isolator that utilizes the sky-hook damper effect is 0 dB and, in theory, a figure of less than 0 dB is not obtained. However, with an active vibration isolator that utilizes the sky-hook damper and sky-hook spring effects, the transmissibility in the region of extremely low frequencies can be made less than 0 dB.

In the prior art, however, there are no appropriate means usable as vibration measurement means and signal processing applied to the output of the vibration measurement means is unsatisfactory. In the active vibration isolator, therefore, especially one having air springs as actuators, the sky-hook spring effect is not utilized.

(2) In accordance with the first aspect of the present invention, appropriate feedback compensation is applied using vibration measurement means which outputs both acceleration and velocity signals simultaneously. This makes it possible to readily implement a sky-hook damper and a sky-hook spring in an effective manner.

(3) In accordance with the first aspect of the present invention, the drive characteristic of an air-spring actuator is modeled accurately and it is necessary to apply compensation that reflects this in order to obtain the sky-hook spring effect by driving the air-spring actuator. Though this is of course possible in theory, it is difficult in practice to build in the characteristic of the air-spring actuator stably. It is troublesome, therefore, to implement the sky-hook spring effect by driving the air-spring actuator.

According to the second aspect of the present invention, therefore, the output of the vibration measurement means, e.g., a velocity sensor, is compensated for in appropriate fashion and an electromagnetic motor having a high degree of linearity is driven based upon the compensated signal, thereby achieving the sky-hook spring effect. As a result, there is no ambiguity in the driving characteristic in the low-frequency range, unlike the case with the air-spring actuator. In other words, a sky-hook spring effect that is stable in the low-frequency range can be achieved by driving the electromagnetic motor.

(4) Disturbance, especially in the region of extremely low frequencies, can be suppressed to the maximum extent by an active vibration isolator in which an ideal sky-hook spring effect is implemented. Accordingly, in cases where the active vibration isolator of the present invention is incorporated in a semiconductor exposure apparatus (a stepper or scanner), an advantage is that the apparatus can be installed even at locations where there is a large amount of floor vibration. The invention is likely to be more effective than the prior art in suppressing the influence of floor vibration on a semiconductor exposure apparatus.

(5) Accordingly, the exposure apparatus, exposure method and device manufacturing method of the present invention have the effect of contributing to productivity.

As many apparently widely different embodiments of the present invention can be made without departing from the spirit and scope thereof, it is to be understood that the invention is not limited to the specific embodiments thereof except as defined in the appended claims.

What is claimed is:

1. An active vibration isolator comprising:
a vibration isolation platform on which an object to be isolated from vibration is mounted;
an air-spring actuator which supports said vibration isolation platform, said air-spring actuator including a valve, which is subjected to feedback drive;
vibration measurement means which measures vibration of said vibration isolation platform and outputs acceleration and velocity signals;
position measurement means which measures position of said vibration isolation platform;
a first feedback loop for feeding back an output of force measurement means, which measures a working force applied by said air-spring actuator to said vibration isolation platform, thereby controlling the working force applied by said air-spring actuator;
a second feedback loop, having a PI compensator, wherein signals of said vibration measurement means are fed back to an input side of said PI compensator, for producing damping and spring effects which act upon said vibration isolation platform; and
a third feedback loop for feeding back an output from said position measurement means, thereby positioning said vibration isolation platform at a designated position.

2. The active vibration isolator according to claim 1, wherein said second feedback loop has a PI compensator, which relates to the acceleration that has been fed back, for producing the damping effect, the spring effect being produced by subjecting the velocity that has been fed back to integration compensation in accordance with an integration characteristic of said PI compensator.

3. The active vibration isolator according to claim 1, wherein said vibration measurement means itself constructs a closed loop for obtaining outputs of the acceleration and velocity, the outputs of acceleration and velocity being obtained from this loop simultaneously.

4. The active vibration isolator according to claim 1, wherein said vibration measurement means detects a velocity component of vibration of a pendulum, inputs the velocity component to a differentiating circuit and applies a force to the pendulum that restores the pendulum to an equilibrium position based upon a differentiated output from the differentiating circuit.

5. The active vibration isolator according to claim 1, wherein said force measurement means measures one of a force which said air-spring actuator applies to said vibration isolation table and an internal pressure of said air spring actuator.

6. An exposure apparatus having a stage for holding a substrate and positioning the substrate at an exposure position, wherein the substrate positioned at the exposure position is exposed, said exposure apparatus including the active vibration isolator, which is described in claim 1, for holding said stage.

7. An exposure method for holding a substrate and positioning the substrate at an exposure position by a stage, and exposing the positioned substrate, wherein the stage is isolated from vibration by being mounted on the active vibration isolator described in claim 1.

8. A device manufacturing method for manufacturing a device by holding and positioning a substrate at an exposure position by a stage and exposing the positioned substrate, wherein the stage is isolated from vibration by being mounted on the active vibration isolator described in claim 1.

9. An active vibration isolator comprising:
a vibration isolation platform on which an object to be isolated from vibration is mounted;
an electromagnetic motor having a plurality of active support legs for supporting said vibration isolation platform, in which each support leg drives said vibration isolation platform; and
vibration measurement means which measures vibration of said vibration isolation platform, wherein a sky-hook spring effect is realized by driving said electromagnetic motor upon compensating for an output from said vibration measurement means appropriately.

10. The active vibration isolator according to claim 9, further comprising:
an air-spring actuator; and
position measurement means,
wherein positioning is carried out by driving said air-spring actuator upon compensating for an output from said position measurement means appropriately and a sky-hook damper effect is realized, in addition to the sky-hook spring effect, by driving said electromagnetic motor upon compensating for an output from said vibration measurement means appropriately.

11. The active vibration isolator according to claim 9, wherein said vibration measurement means is a velocity sensor.

12. An exposure apparatus having a stage for holding a substrate and positioning the substrate at an exposure position, wherein the substrate positioned at the exposure position is exposed, said exposure apparatus including the active vibration isolator, which is described in claim 9, for holding said stage.

13. An exposure method for holding and positioning a substrate at an exposure position by a stage and exposing the positioned substrate, wherein the stage is isolated from vibration by being mounted on the active vibration isolator described in claim 9.

14. A device manufacturing method for manufacturing a device by holding and positioning a substrate at an exposure position by a stage and exposing the positioned substrate, wherein the stage is isolated from vibration by being mounted on the active vibration isolator described in claim 9.

15. An active vibration isolator comprising:
   a vibration isolation platform on which an object to be isolated from vibration is mounted;
   an actuator having an air-spring actuator and supporting said platform, said air-spring actuator having a valve which is subjected to feedback drive;
   a vibration sensor measuring vibration of said vibration isolation platform and outputting acceleration and velocity signals; and
   a feedback loop having a PI compensator, wherein the signals of said vibration sensor are fed back to an input side of said PI compensator.

16. The active vibration isolator according to claim 15, wherein said vibration sensor is capable of outputting both acceleration and velocity signals at the same time.

17. The active vibration isolator according to claim 15, wherein said vibration sensor is an element of a closed loop for obtaining outputs of the acceleration and velocity signals.

18. The active vibration isolator according to claim 15, wherein said vibration sensor detects a velocity component of vibration of a pendulum, inputs the velocity component to a differentiating circuit and applies a force to the pendulum that restores the pendulum to an equilibrium position based upon a differentiated output from the differentiating circuit.

19. The active vibration isolator according to claim 15, further comprising a force sensor measuring one of a force which said air-spring actuator applies to said platform and an internal pressure of said air-spring actuator.

* * * * *

UNITED STATES PATENT AND TRADEMARK OFFICE
CERTIFICATE OF CORRECTION

PATENT NO. : 6,286,644 B1
DATED : September 11, 2001
INVENTOR(S) : Shinji Wakui

It is certified that error appears in the above-identified patent and that said Letters Patent is hereby corrected as shown below:

Column 7,
Line 59, "to" should read -- to a --.

Column 18,
Line 22, "air spring" should read -- air-spring --.

Signed and Sealed this

Sixth Day of May, 2003

JAMES E. ROGAN
*Director of the United States Patent and Trademark Office*